United States Patent
Aderhold et al.

(10) Patent No.: US 7,195,934 B2
(45) Date of Patent: Mar. 27, 2007

(54) METHOD AND SYSTEM FOR DEPOSITION TUNING IN AN EPITAXIAL FILM GROWTH APPARATUS

(75) Inventors: Wolfgang R. Aderhold, Cupertino, CA (US); Ali Zojaji, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/178,973

(22) Filed: Jul. 11, 2005

(65) Prior Publication Data
US 2007/0010033 A1 Jan. 11, 2007

(51) Int. Cl.
*H01L 21/66* (2006.01)
*G01R 31/26* (2006.01)

(52) U.S. Cl. .............. 438/14; 438/481; 438/752; 438/753; 324/500

(58) Field of Classification Search ........... 438/14, 438/481, FOR. 142, FOR. 101, 752, 753, 438/199, 222, 207, 478; 324/500; 117/105, 117/84, 101
See application file for complete search history.

(56) References Cited

U.S. PATENT DOCUMENTS

| | | | |
|---|---|---|---|
| 6,123,766 A | 9/2000 | Williams et al. | |
| 6,164,816 A | 12/2000 | Aderhold et al. | |
| 6,436,194 B1 | 8/2002 | Carlson et al. | |
| 6,562,720 B2 | 5/2003 | Thilderkvist et al. | |
| 6,637,930 B2 | 10/2003 | Butchers et al. | |
| 2001/0001384 A1* | 5/2001 | Arai et al. ................. 117/84 |
| 2004/0052512 A1 | 3/2004 | Aderhold et al. | |
| 2004/0219735 A1* | 11/2004 | Brabant et al. ............ 438/222 |
| 2005/0092235 A1* | 5/2005 | Brabant et al. ............ 117/105 |
| 2005/0136584 A1* | 6/2005 | Boyanov et al. ........... 438/199 |

FOREIGN PATENT DOCUMENTS

| | | |
|---|---|---|
| EP | 0 757 117 A1 | 6/1995 |
| GB | 2 273 391 A | 6/1994 |
| WO | WO 02/064853 A2 | 8/2002 |
| WO | WO 2005/104206 A1 | 11/2005 |

* cited by examiner

*Primary Examiner*—Michelle Estrada
*Assistant Examiner*—Nicholas J. Tobergte
(74) *Attorney, Agent, or Firm*—Townsend and Townsend and Crew, LLP

(57) ABSTRACT

A method of calculating a process parameter for a deposition of an epitaxial layer on a substrate. The method includes the steps of measuring an effect of the process parameter on a thickness of the epitaxial layer to determine a gain curve for the process parameter, and calculating, using the gain curve, a value for the process parameter to achieve a target thickness of the epitaxial layer. The value is calculated to minimize deviations from the target thickness in the layer. Also, a substrate processing system comprising that includes a processor to calculate a value for the process parameter to achieve a substantially uniform epitaxial layer of a target thickness on the substrate, where the value is calculated using a gain curve derived from measurements of layer uniformity as a function of the value of the process parameter.

23 Claims, 7 Drawing Sheets

METHOD AND SYSTEM FOR DEPOSITION TUNING IN AN EPITAXIAL FILM GROWTH APPARATUS

BACKGROUND OF THE INVENTION

Modern processes for manufacturing semiconductor devices require precise adjustment of many process parameters to achieve high levels of device performance, product yield, and overall product quality. For processes that include the formation of semiconductive layers on substrates with epitaxial film growth, numerous process parameters have to be carefully controlled, including the substrate temperature, the pressures and flow rates precursor materials, the formation time, and the distribution of power among the heating elements surrounding the substrate, among other process parameters.

Current trends in CMOS technology are favoring processes that can produce increasingly thin layers (e.g., dielectric layers only 60–80 Å thick or less), and films with increasing complexity. For example, conventional BiCMOS devices, using single-element silicon (Si) films, are being displaced by two-element, silicon-germanium (SiGe) films that have superior qualities in logic and DRAM devices. As the sizes of these devices continue to shrink, the uniformity of the film thickness and composition across the substrate becomes increasingly important. Maintaining a high level of uniformity is made even more challenging due to the increasing sizes of the substrates, with the standard substrate wafer diameter moving from 200 mm to 300 mm, and beyond.

In many conventional semiconductor manufacturing process, including epitaxial film growth processes ("EPI processes"), process parameters can be manually adjusted to make films with the requisite uniformity of film thickness and composition. In EPI processes for making alloy films (e.g., SiGe films), especially doped alloy films, the sensitivity of several process parameters on film quality is increased, making it more difficult to tune these parameters by hand. The increased sensitivity makes manual control of semiconductor film growth processes much more difficult, if not impossible.

There is also increasing complexity in the relationship between process parameters and the qualities of the manufactured film layer. Increasingly, the interdependences of multiple process parameters on a property of the layer make it more difficult to find optimum values for the parameters to achieve a target value for the property. For example, in an EPI process trying to achieve a target thickness uniformity of a film layer across the substrate, the interdependences of the power ratios between inner/outer and upper/lower substrate heating elements have to be understood. Only with this understanding can the process operator set the parameters to values that result in a sufficiently uniform thickness of the deposited layer. Moreover, the interdependence of the parameters make determining the parameter values much more difficult than if the effects of each parameter on thickness uniformity were completely independent.

Thus, there is a need for systems and methods of tuning process parameters in semiconductor film growth processes that reduce or eliminate the manual adjustment of the process parameters. There is also a need for systems and methods to determine values of interdependent process parameters for making a film layer with the desired properties. These and other needs for semiconductor film making systems and processes are addressed by the present invention.

BRIEF SUMMARY OF THE INVENTION

Embodiments of the invention include a method of calculating a process parameter for a deposition of an epitaxial layer on a substrate. The method includes the steps of measuring an effect of the process parameter on a thickness of the epitaxial layer to determine a gain curve for the process parameter, and calculating, using the gain curve, a value for the process parameter to achieve a target thickness of the epitaxial layer. The value is calculated to minimize deviations from the target thickness in the layer.

Embodiments of the invention also include a method of calculating process parameters for a deposition of an epitaxial layer. The method includes the steps of determining a first gain equation comprising a first relationship between a first process parameter and a thickness of the epitaxial layer, and determining a second gain equation comprising a second relationship between a second process parameter and the thickness of the epitaxial layer. The method also includes calculating, using the first and second gain equations, values for the first and second process parameters to achieve the target thickness. The values are calculated to give a uniform distribution of a component of the epitaxial layer.

Embodiments of the invention further relate to a substrate processing system. The system may include a chamber, a substrate holder, located within the chamber, to hold a substrate, a precursor delivery system to introduce one or more precursors into the chamber, a heating system to heat the substrate, and a controller to control a process parameter in the precursor delivery system or the heating system. The system may also include a processor to calculate a value for the process parameter to achieve a substantially uniform epitaxial layer of a target thickness on the substrate. The value is calculated using a gain curve derived from measurements of layer uniformity as a function of the value of the process parameter.

Another embodiment of the invention relates to a system to calculate a process parameter for a deposition of an epitaxial layer on a substrate. The system may include a processor arranged to obtain a value for the process parameter to achieve a target thickness of the epitaxial layer. The value for the process parameter may be obtained by measuring an effect of the process parameter on a thickness of the epitaxial layer to determine a gain curve for the process parameter, and calculating, using the gain curve, a value for the process parameter to achieve a target thickness of the epitaxial layer. The value for the process parameter may be calculated to minimize deviations from the target thickness in the layer.

Additional embodiments of the invention include methods of setting a process parameter for a deposition of an epitaxial layer on a substrate. The methods include measuring an effect of a process parameter on a concentration distribution of a material in the epitaxial layer to determine an effect profile for the process parameter, and calculating, using the effect profile, a value for the process parameter to achieve a target concentration profile of the material in the epitaxial layer. The value of the process parameter is calculated to minimize deviations from the target concentration profile in the layer.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION OF THE INVENTION

Methods and systems are described for tuning parameters in an epitaxial film growth process in order to achieve films with a desired thickness uniformity and/or compositional distribution. Tunable process parameters include power settings for heating elements in the various substrate heating zones of the process chamber, and partial pressures and flow rate settings of the process gases used in the chamber, among other parameters.

The methods include the creation of gain curves and/or algorithms that model the effects of the process parameters on the characteristics of the films. For example, a gain curve may be determined that plots a ratio of the power delivered to heating elements in different substrate heating zones (i.e., the process parameter) against variations in the thickness of the film layer. The gain curve may be used to calculate a power ratio that forms a film layer with minimized variations from a target thickness. Additional aspects of embodiments of the methods will now be described.

Exemplary Methods

Figure 1A:
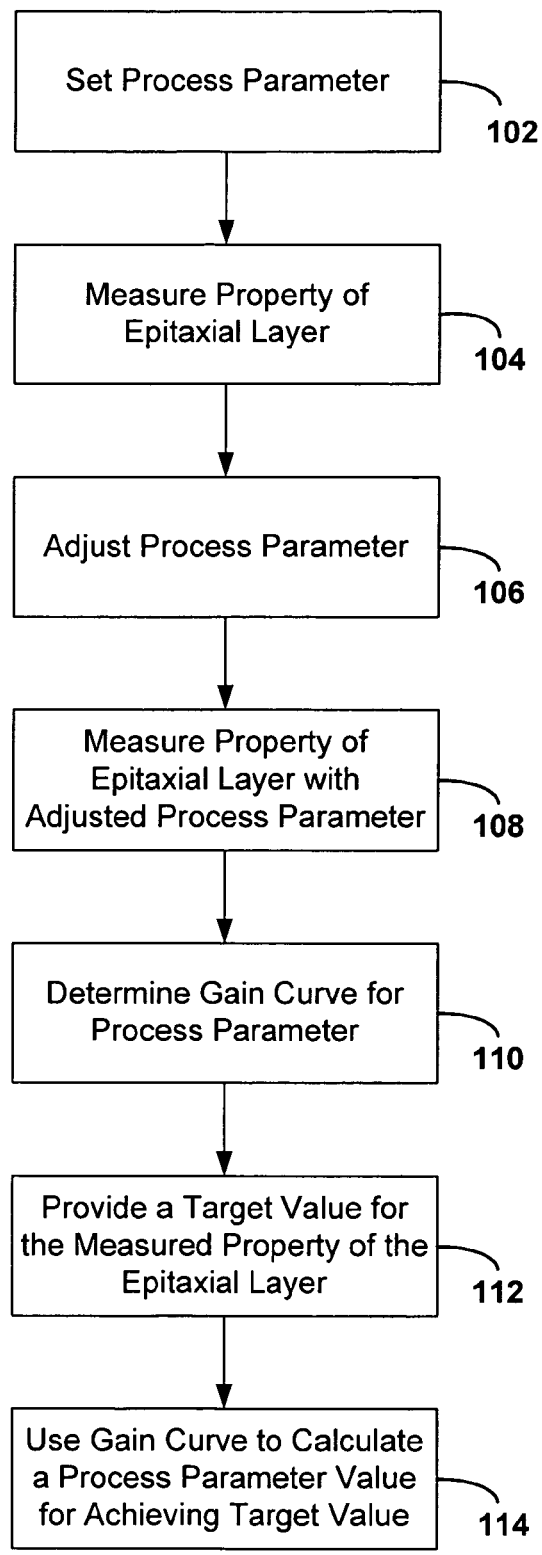
FIG. 1A is a flowchart showing methods of determining a process parameter for the formation of an epitaxial film layer according to embodiments of the invention.

FIG. 1A shows a flowchart that outlines steps in a method of calculating a process parameter in an epitaxial growth process according to embodiments of the invention. The method includes steps to determine a gain curve for a process parameter. This may include setting the process parameter to a particular value 102, and measuring a property of interest of the film formed with that value for the process parameter 104. The process parameter is then adjusted 106, and the property of interest is measured on a new film that is formed with the adjusted value of the process parameter 108. A gain curve may be determined 110, which plots the film property as a function of the value of the process parameter. Additional measurements of the property may be taken after further adjustments of the process parameter to better resolve the gain curve. For example, measurements of a film property, such as thickness uniformity, may be plotted according to a plurality of incremental changes in a process parameter, such as the power ratio of two substrate heating zones, to determine the gain curve.

An accurate gain curve permits the tuning of process parameters to achieve an epitaxial growth film with target properties without further experimentation. Thus, the method may include providing a target value for a property of the film 112, and using the gain curve to calculate a process parameter value for achieving the target value 114. The target property may be provided to a computer programmed with the gain curve, and capable of calculating the process parameter value based on the target value. Alternatively, an EPI process operator may manually determine the target value from a plot of the gain curve. In more complex models, multiple gain curves may be provided to a computer that is operable to output values for a plurality of process parameters based on one or more desired target values for film properties.

Figure 1B:
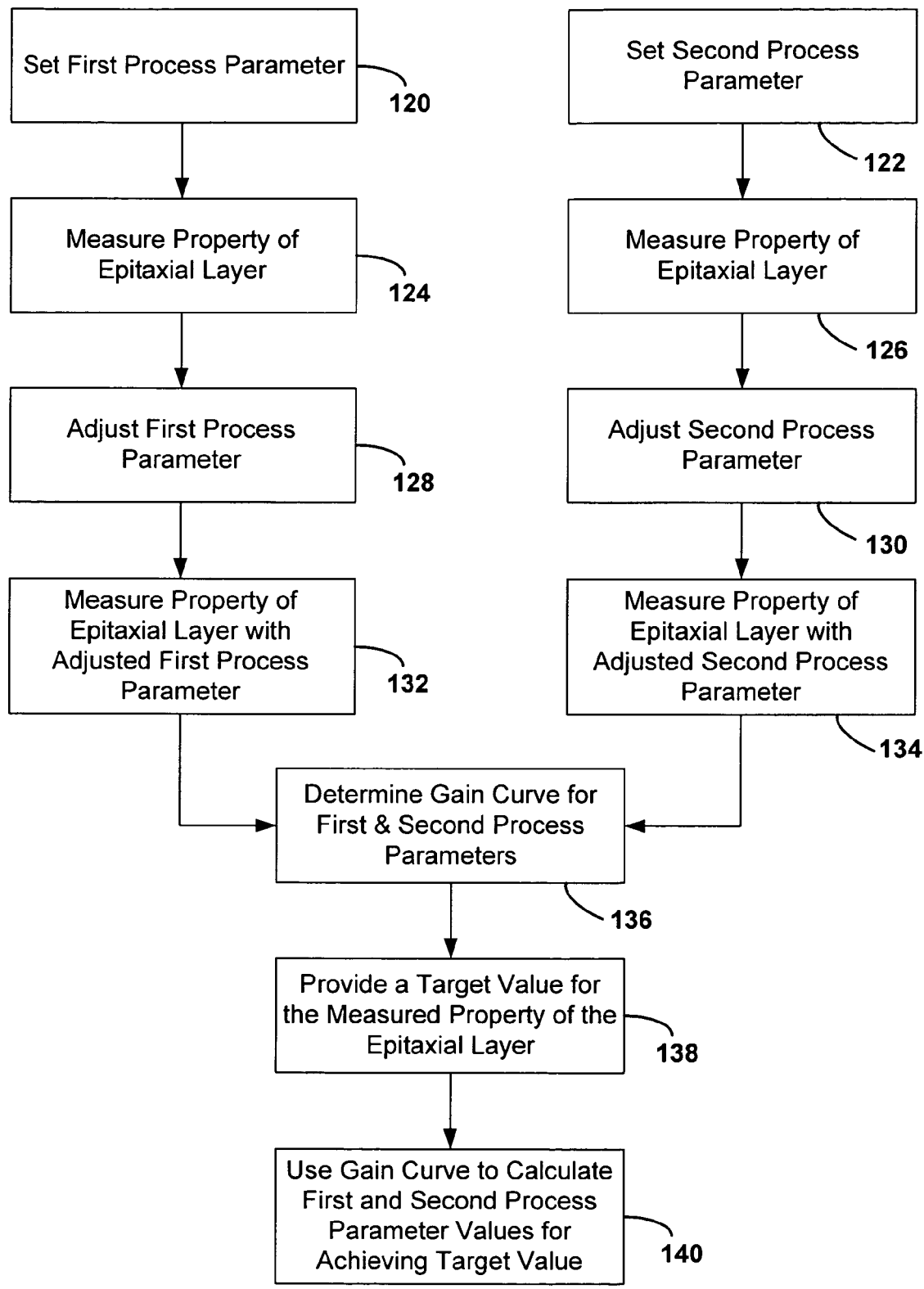
FIG. 1B is a flowchart showing methods of determining a first and second process parameter for formation of an epitaxial film layer according to embodiments of the invention.

For example, the flowchart shown in FIG. 1B has steps for determining a two-variable gain curve. Embodiments of the method may include setting of a first and second process parameter 120, 122. A property of the resulting epitaxial film layer is measured for these values of the process parameter 124, 126. Then, both the first and second process parameters may be adjusted 128, 130, and the property of the film layer measured again with the new process parameter settings 132, 134. A two-parameter gain curve may be determined 136, which plots the film property as a function of both process parameters. The steps of adjusting the process parameters and measuring the effects on the film property may be repeated multiple times to enhance the resolution of the gain curve.

The two-parameter gain curve permits the tuning of the process parameters to achieve an epitaxial growth film with a target value of the property without further experimentation. Thus, the method may include providing a target value for a property of the film 138, and using the gain curve to calculate first and second process parameter values for achieving the target value 140. Embodiments with even more complex algorithms and/or gain curves that are dependent on three or more process parameters are also contemplated.

Figure 1C:
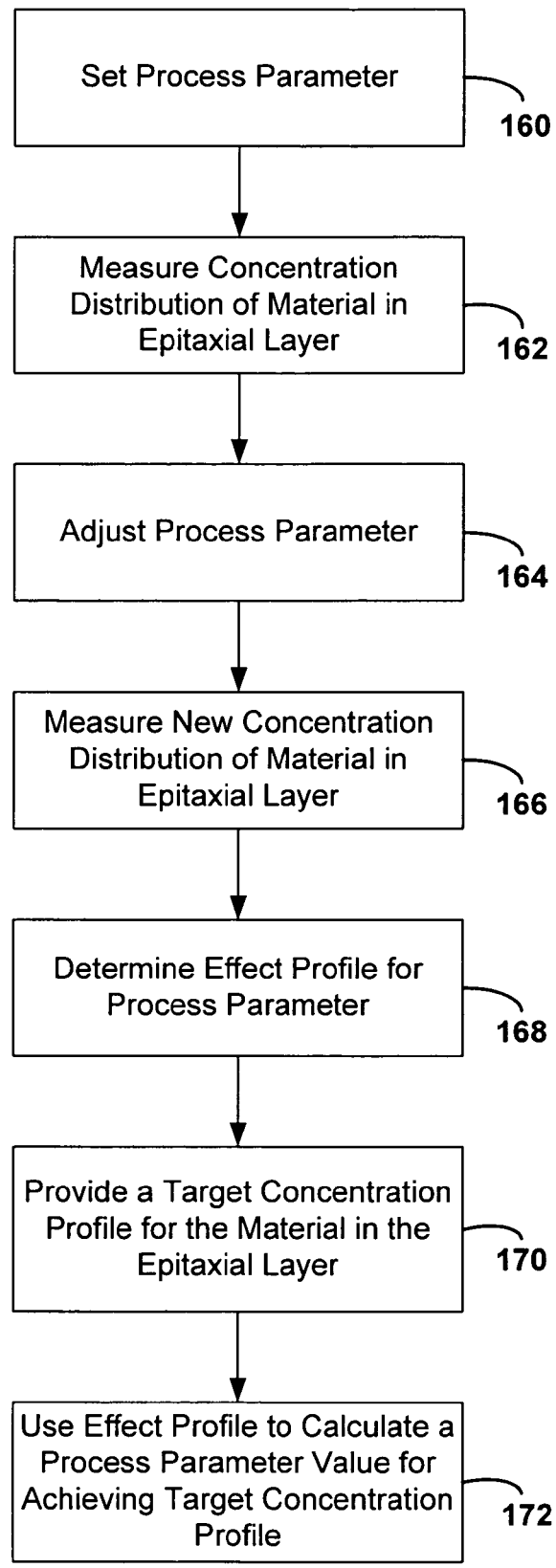
FIG. 1C is a flowchart showing methods of setting a process parameter for the formation of an epitaxial film layer according to additional embodiments of the invention.

Referring now to FIG. 1C, a flowchart is shown for methods of setting a process parameter for the formation of an epitaxial film layer according to additional embodiments of the invention. The methods include steps to determine effect profiles that relate the values of one or more process parameters on a concentration distribution profile of a material in the epitaxial layer. The steps may include setting the process parameter to a particular value 160, and measuring the concentration distribution of the material in the epitaxial layer for that value for the process parameter 162. The process parameter is then adjusted 164, and the concentration distribution measured on a new film that is formed with the adjusted value of the process parameter 166. After incrementally adjusting the value of the process parameter a number of times (e.g., increasing the value of the parameter by 5% increments) an effect profile may be determined 168, which plots the concentration distribution as a function of the value of the process parameter. Additional measurements of the property may be taken after further adjustments of the process parameter to better resolve the effect profile (e.g. measuring changes in the concentration distribution for 1% increments in the value of the process parameter).

An accurate effect profile permits the tuning of process parameter to achieve a target concentration profile of a material in the epitaxial layer without further experimentation. Thus in this embodiment, the methods include providing a target concentration profile 170 of a material, such as boron, phosphorus, arsenic, germanium, indium, gallium, tin, carbon, nitrogen, oxygen, etc., and using the effect profile to calculate a process parameter value for achieving the target profile 172. The target concentration profile may be provided to a computer programmed with the effect profile, and capable of calculating one or more process parameter values based on the target profile. Alternatively, an EPI process operator may manually determine target values from a plot of the effect profile. In more complex models, multiple effect profiles may be provided to a computer that is operable to output values for a plurality of process parameters based on the target concentration profiles for one or more materials.

Exemplary Systems

Figure 2A:
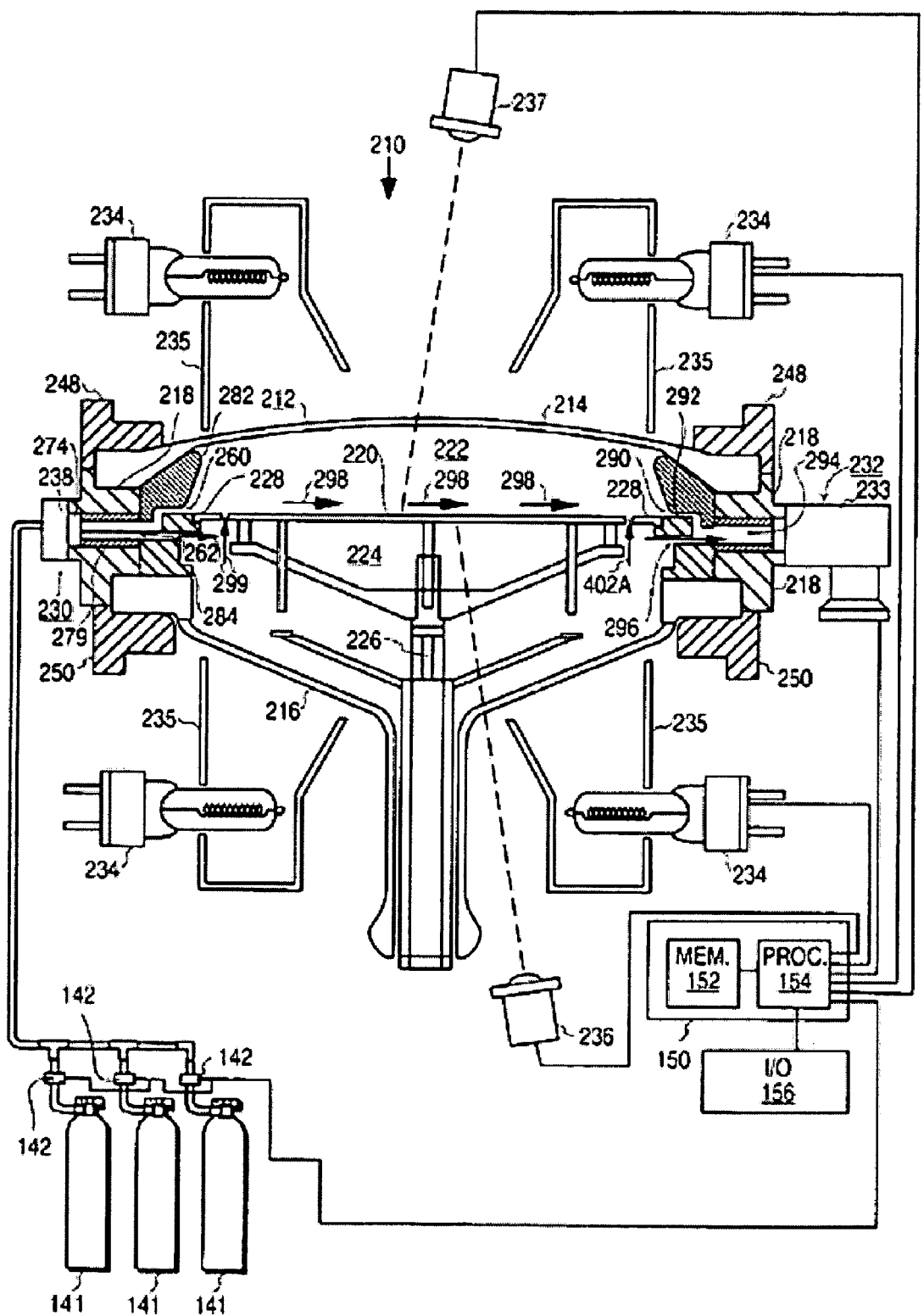
FIGS. 2A–B shows aspects of a substrate processing system according to embodiments of the invention.
Figure 2B:
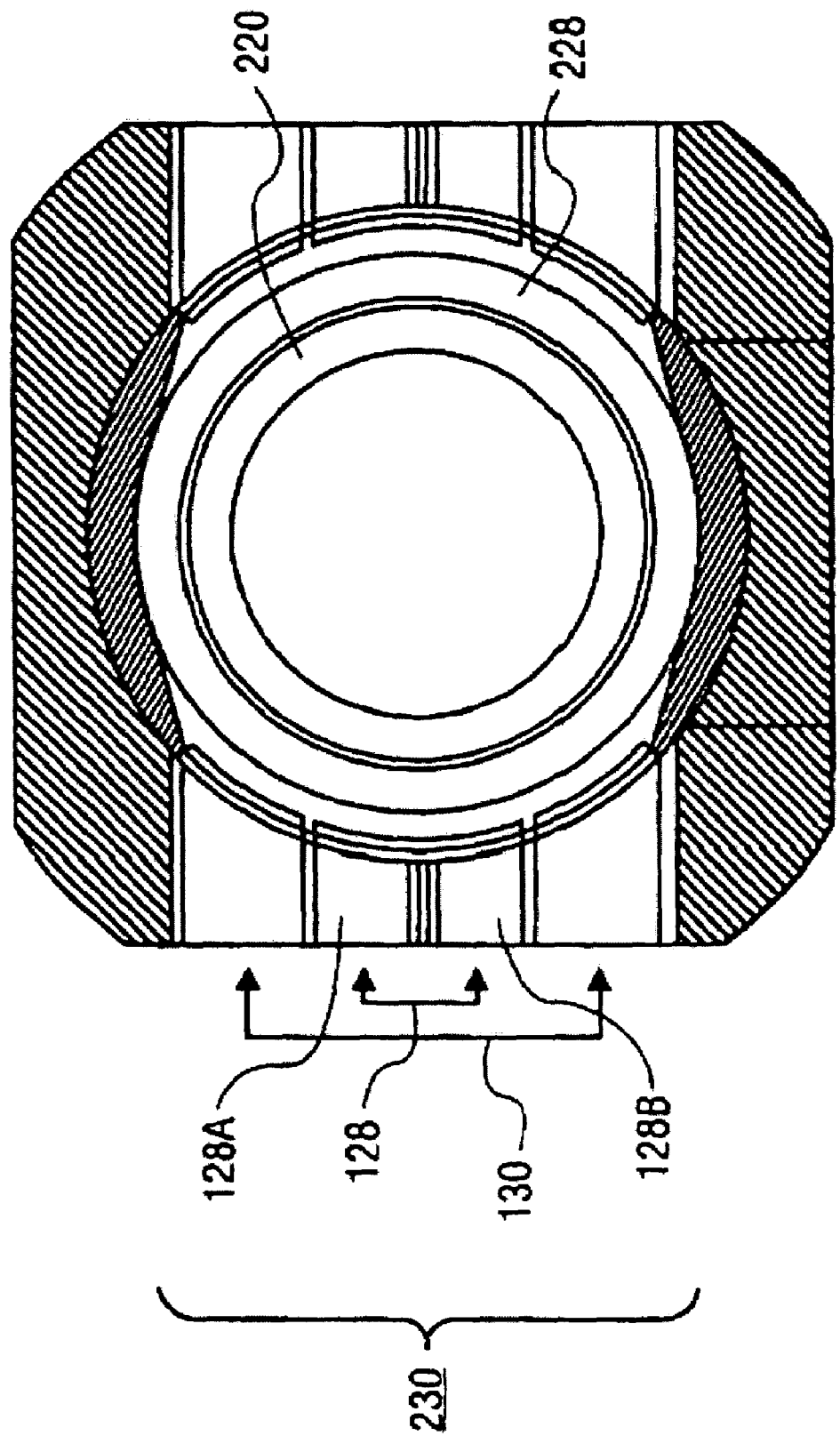

FIGS. 2A–B shows an example of a substrate processing system according to embodiments of the invention. The processing apparatus 210 shown in FIG. 2A is a deposition reactor and comprises a deposition chamber 212 having an upper dome 214, a lower dome 216 and a sidewall 218 between the upper and lower domes 214 and 216. Cooling fluid (not shown) may be circulated through sidewall 218 to cool o-rings used to seal domes 214 and 216 against sidewall 218. An upper liner 282 and a lower liner 284 are mounted against the inside surface of sidewall 218. The upper and lower domes 214 and 216 are made of a transparent material to allow heating light to pass through into the deposition chamber 212.

Within the chamber 212 is a flat, circular susceptor 220 for supporting a wafer in a horizontal position. The susceptor 220 extends transversely across the chamber 212 at the sidewall 218 to divide the chamber 212 into an upper portion 222 above the susceptor 220 and a lower portion 224 below the susceptor 220. The susceptor 220 is mounted on a shaft 226 which extends perpendicularly downward from the center of the bottom of the susceptor 220. The shaft 226 is connected to a motor (not shown) which rotates shaft 226 and thereby rotates the susceptor 220. An annular preheat ring 228 is connected at its outer periphery to the inside periphery of lower liner 284 and extends around the susceptor 220. The pre-heat ring 228 is in the same plane as the susceptor 220 with the inner edge of the pre-heat ring 228 separated by a gap 402A from the outer edge of the susceptor 220.

An inlet manifold 230 is positioned in the side of chamber 212 and is adapted to admit gas from a source of gas or gases, such as tank 141, into the chamber 212. An outlet port 232 is positioned in the side of chamber 212 diagonally opposite the inlet manifold and is adapted to exhaust gases from the deposition chamber 212.

A plurality of high intensity lamps 234 are mounted around the chamber 212 and direct their light through the upper and lower domes 214 and 216 onto the susceptor 220 (and preheat ring 228) to heat the susceptor 220 (and preheat ring 228). Susceptor 220 and preheat ring 228 are made of a material, such as silicon carbide, coated graphite which is opaque to the radiation emitted from lamps 234 so that they can be heated by radiation from lamps 234. The upper and lower domes 214 and 216 are made of a material which is transparent to the light from the lamps 234, such as clear quartz. The upper and lower domes 214 and 216 are generally made of quartz because quartz is transparent to light of both visible and IR frequencies; it exhibits a relatively high structural strength; and it is chemically stable in the process environment of the deposition chamber 212. Although lamps are the preferred means for heating wafers in deposition chamber 220, other methods may be used such as resistance heaters and RF inductive heaters. An infrared temperature sensor 236 such as a pyrometer is mounted below the lower dome 216 and faces the bottom surface of the susceptor 220 through the lower dome 216. The temperature sensor 236, is used to monitor the temperature of the susceptor 220 by receiving infra-red radiation emitted from the susceptor 220 when the susceptor 220 is heated. A temperature sensor 237 for measuring the temperature of a wafer may also be included if desired.

An upper clamping ring 248 extends around the periphery of the outer surface of the upper dome 214. A lower clamping ring 250 extends around the periphery of the outer surface of the lower dome 216. The upper and lower clamping rings 248 and 250 are secured together so as to clamp the upper and lower domes 214 and 216 to the side wall 218.

Reactor 210 includes a gas inlet manifold 230 for feeding process gas into chamber 212. Gas inlet manifold 230 includes a connector cap 238, a baffle 274, an insert plate 279 positioned within sidewall 218, and a passage 260 formed between upper liner 282 and lower liner 284. Passage 260 is connected to the upper portion 222 of chamber 212. Process gas from gas cap 238 passes through baffle 274, insert plate 279 and passage 260 and into the upper portion 222 of chamber 212.

Reactor 210 also includes an independent inert gas inlet 262 for feeding an inert purge gas, such as but not limited to, hydrogen ($H_2$) and nitrogen ($N_2$), into the lower portion 224 of deposition chamber 212. As shown in FIG. 2A, inert purge gas inlet 262 can be integrated into gas inlet manifold 230, if desired, as long as a physically separate and distinct passage 260 through baffle 274, insert plate 279, and lower liner 284 is provided for the inert gas, so that the inert purge gas can be controlled and directed independent of the process gas. Inert purge gas inlet 262 need not necessarily be integrated or positioned along with gas inlet manifold 230, and can for example be positioned on reactor 210 at an angle of 90° from deposition gas inlet manifold 230.

Reactor 210 also includes a gas outlet 232. The gas outlet 232 includes an exhaust passage 290 which extends from the upper chamber portion 222 to the outside diameter of sidewall 218. Exhaust passage 290 includes an upper passage 292 formed between upper liner 282 and lower liner 284 and which extends between the upper chamber portion 222 and the inner diameter of sidewall 218. Additionally, exhaust passage 290 includes an exhaust channel 294 formed within insert plate 279 positioned within sidewall 218. A vacuum source, such as a pump (not shown) for creating low or reduced pressure in chamber 212 is coupled to exhaust channel 294 on the exterior of sidewall 218 by an outlet pipe 233. Thus, process gas fed into the upper chamber portion 222 is exhausted through the upper passage 292, through exhaust channel 294 and into outlet pipe 233.

The single wafer reactor shown in FIG. 2A is a "cold wall" reactor. That is, sidewall 218 and upper and lower liners 282 and 284, respectively, are at a substantially lower temperature than preheat ring 228 and susceptor 220 (and a wafer placed thereon) during processing. For example, in a process to deposit an epitaxial silicon film on a wafer, the susceptor and wafer are heated to a temperature of between 550–1200° C., while the sidewall (and liners) are at a temperature of about 400–600° C. The sidewall and liners are at a cooler temperature because they do not receive direct irradiation from lamps 234 due to reflectors 235, and because cooling fluid is circulated through sidewall 218.

Gas outlet 232 also includes a vent 296 which extends from the lower chamber portion 224 through lower liner 284 to exhaust passage 290. Vent 296 preferably intersects the upper passage 292 of exhaust passage 290 as shown in FIG. 2A. Inert purge gas is exhausted from the lower chamber portion 224 through vent 296, through a portion of upper chamber passage 292, through exhaust channel 294, and into outlet pipe 233. Vent 296 allows for the direct exhausting of purge gas from the lower chamber portion to exhaust passage 290.

According to the present invention, process gas or gases 298 are fed into the upper chamber portion 222 from gas inlet manifold 230. A process gas, according to the present invention, is defined as a gas or gas mixture which acts to remove, treat, or deposit a film on a wafer or a substrate placed in chamber 212. According to the present invention, a process gas comprising HCl and an inert gas, such as $H_2$, is used to treat a silicon surface by removing and smoothing the silicon surface. In an embodiment of the present invention a process gas is used to deposit a silicon epitaxial layer on a silicon surface of a wafer placed on susceptor 220 after the silicon surface has been treated. Process gas 298 generally includes a silicon source, such as but not limited to, monosilane, trichlorosilane, dichlorosilane, and tetrachlorosilane, methyl-silane, and a dopant gas source, such as but rot limited to phosphine, diborane, germaine, and arsine, among others, as well as other process gases such as oxygen, methane, ammonia, etc. A carrier gas, such as $H_2$, is generally included in the deposition gas stream. For a process chamber with a volume of approximately 5 liters, a deposition process gas stream between 35–75 SLM (including carrier gas) is typically fed into the upper chamber portion 222 to deposit a layer of silicon on a wafer. The flow of process gas 298 is essentially a laminar flow from inlet passage 260, across preheat ring 228, across susceptor 220 (and wafer), across the opposite side of preheat ring 228, and out exhaust passage 290. The process gas is heated to a deposition or process temperature by preheat ring 228, susceptor 220, and the wafer being processed. In a process to deposit an epitaxial silicon layer on a wafer, the susceptor and preheat ring are heated to a temperature of between 800° C.–1200° C. A silicon epitaxial film can be formed at temperatures as low as 550° C. with silane by using a reduced deposition pressure.

Additionally, while process gas is fed into the upper chamber portion, an inert purge gas or gases 299 are fed independently into the lower chamber portion 224. An inert purge gas is defined as a gas which is substantially unreactive at process temperatures with chamber features and wafers placed in deposition chamber 212. The inert purge gas is heated by preheat ring 228 and susceptor 220 to essentially the same temperature as the process gas while in chamber 212. Inert purge gas 299 is fed into the lower chamber portion 224 at a rate which develops a positive pressure within lower chamber portion 224 with respect to the process gas pressure in the upper chamber portion 222. Process gas 298 is therefore prevented from seeping down through gap 402A and into the lower chamber portion 224, and depositing on the backside of susceptor 220.

FIG. 2B shows a portion of the gas inlet manifold 230 which supplies gas to the upper zone of the processing chamber. In FIG. 2B the insert plate is shown to be constituted by an inner zone 128 and an outer zone 130. According to this embodiment of the invention the composition of the process gas which flows into inner zone 128 can be controlled independently of the composition of the gas which flows into outer zone 130. In addition, the flow rate of the gas to either of the two halves 128a–128b of the inner zone 128 can be further controlled independently from one another. This provides two degrees of control for the gas flow for the purposes of controlling the composition of the process gas mix over different zones of the semiconductor wafer.

Processing apparatus 210 shown in FIG. 2A includes a system controller 150 which controls various operations of apparatus 210 such as controlling gas flows, substrate temperature, and chamber pressure. In an embodiment of the present invention the system controller 150 includes a hard disk drive (memory 152), a floppy disk drive and a processor 154. The processor contains a single board computer (SBC), analog and digital input/output boards, interface boards and stepper motor controller board. Various parts of processing apparatus 210 conform to the Versa Modular Europeans (VME) standard which defines board, card cage, and connector dimensions and types. The VME standard also defines the bus structure having a 16-bit data bus and 24-bit address bus.

System controller 150 controls all of the activities of the apparatus 210. The system controller executes system control software, which is a computer program stored in a computer-readable medium such as a memory 152. Preferably, memory 152 is a hard disk drive, but memory 152 may also be other kinds of memory. The computer program includes sets of instructions that dictate the timing, mixture of gases, chamber pressure, chamber temperature, lamp power levels, susceptor position, and other parameters of a particular process. Of course, other computer programs such as one stored on another memory device including, for example, a floppy disk or another appropriate drive, may also be used to operate system controller 150. An input/output device 156 such as a CRT monitor and a keyboard is used to interface between a user and system controller 150.

The process for smoothing a silicon surface in accordance with the present invention can be implemented using a computer program product which is stored in memory 152 and is executed by processor 154. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program. Also stored in memory 152 are process parameters such as process gas flow rates (e.g., $H_2$ and HCl flow rates), process temperatures and process pressure necessary to carry out the smoothing of silicon films in accordance with the present invention.

Experimental

A Epi process tuning tool was developed for growing doped and undoped silicon (Si), doped and undoped silicon-germanium (SiGe), and/or germanium (Ge) film on substrate wafers (e.g., a 300 mm substrate wafer). The tool was developed from measuring the effects of process parameters including the ratio of heating lamp powers for different heating zones on film uniformity. The experimental results were then entered into a Microsoft Excel spreadsheet that plotted gain curves showing changes in film thickness as a function of the lamp power ratios. The Excel function "solver" was then used to calculate the lamp ratios that would achieve a target film thickness having high uniformity. The Epi process was then run with the calculated values of the power ratios to produce a SiGe film with excellent thickness uniformity properties with one baseline wafer, and one tuning iteration.

The Epi growth process conditions for growing the baseline SiGe film are summarized in Table 1:

TABLE 1

Epi Process Conditions for Growing Baseline SiGe Film

| Process Parameter | Value |
| --- | --- |
| Temperature | 800° C. |
| Lower Power Ratio | 60% |
| Upper Inner/Lower Power Ratio | 50%/12.5% |
| DCS Flow | 100 sccm |
| $GeH_4$ (1%) Flow | 200 sccm |
| HCl Flow | 150 sccm |
| $PH_3$ (1%) Flow | 250 sccm |
| Time | 150 sec |
| Pressure | 20 Torr |
| $H_2$ Main | 30 slm |
| $H_2$ Slit | 3 slm |
| Accuset | 125/125 |

The process conditions for growing the baseline Epi film were set by integration requirements, and to achieve desired electrical properties in the film. A DOE was performed to find values for the baseline process parameters to achieve a selective SiGe layer 300 Å thick, with a 16% germanium content, and a resistivity of 300Ω.

Experimental runs were then conducted with a 300 mm EPI Centura epitaxial film growth system to determine the effects of process parameters on the film uniformity. In a series of DOEs, the process parameters were manipulated around the baseline conditions to measure the effects on the uniformity of film properties such as thickness, resistivity, and germanium concentration. Because the iterative process required a lot of wafers, an attempt was made to find the most sensitive parameters to effecting the uniformity of film properties.

Starting with the baseline process parameters, sensitivity experiments were performed by making small deviations in each parameter, and observing which parameters had the greatest effect on film uniformity. These experiments revealed the accusett for gas flow distribution, and lamp power adjustments had the greatest effect on film uniformity. Because the lamp power could be adjusted with greater resolution, this was the parameter used by the tuning tool to control film uniformity. It was also observed that film thickness uniformity was most representative of uniformity of all the film properties measured, and this was the film property to be controlled by the tuning tool.

The lamp power process parameter was defined by the distribution of lamps around various regions of a substrate that was rotatable on a susceptor in Epi process chamber. The lamps were divided into four regions, called the 1) inner and 2) outer zones of the 3) upper and 4) lower modules. The power supplied to each region is independently adjustable. For a particular set of baseline process parameters, like pressure, gas-flows, and temperature set-point, the lamp power distribution factors for each region can be adjusted for radiation loss. Adjusting lamp power to maintain temperature consistency after changes in process parameters may be assisted by automated control processes like those described in U.S. Pat. No. 6,164,816 to Aderhold et al, titled "TUNING A SUBSTRATE TEMPERATURE MEASUREMENT SYSTEM", the entire contents of which are hereby incorporated by reference for all purposes.

Measurements of thickness uniformity were made after small adjustments to lamp power in each of the regions. The effects were characterized by subtracting the thickness-line-scan measured between the adjusted film and a film formed with the baseline process parameters. The effect of each incremental unit change in the lamp power level on thickness uniformity provided the data to determine a gain curve.

The thickness uniformity data was measured using a 46-point line scan of thickness across the film. The 46-points were equally distributed across two perpendicular lines that intersected at the center of the 300 mm circular substrate wafer. Gain curves were calculated for changes in thickness uniformity as a function of adjustments to the power supplied to each lamp region. The parameters were considered independent, and each parameter had an additive effect on the uniformity of the film thickness. Gain curves plotting the effects of parameter adjustments on film thickness uniformity were entered into a Microsoft Excel spreadsheet, and used to predict a 46-point thickness distribution based on the process parameter settings.

The parameters were calculated to produce a minimal standard deviation in the thickness uniformity using the Excel spreadsheet function "solver". For small changes, the variation in the system is approximated as linear, so linear extrapolation from an input measurement was used to predict the direction of a parameter change that will improve the film thickness uniformity. Non-linear extrapolation models may also be used for predicting parameter settings that minimize variations in film thickness.

Figure 3A:
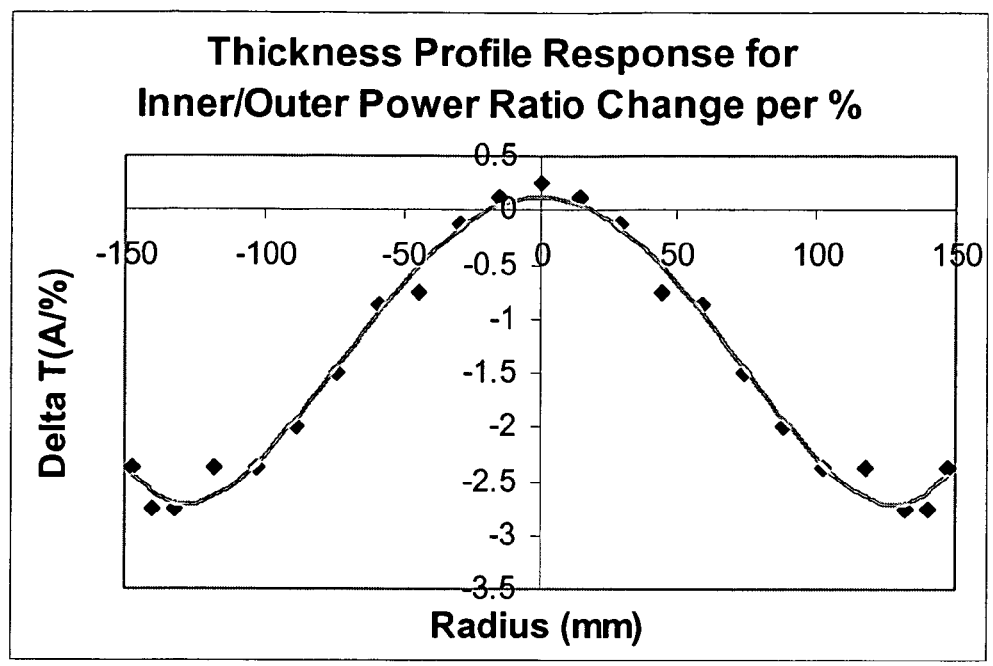
FIGS. 3A–B show film layer thickness profiles across substrate wafers after varying two interdependent process parameters.
Figure 3B:
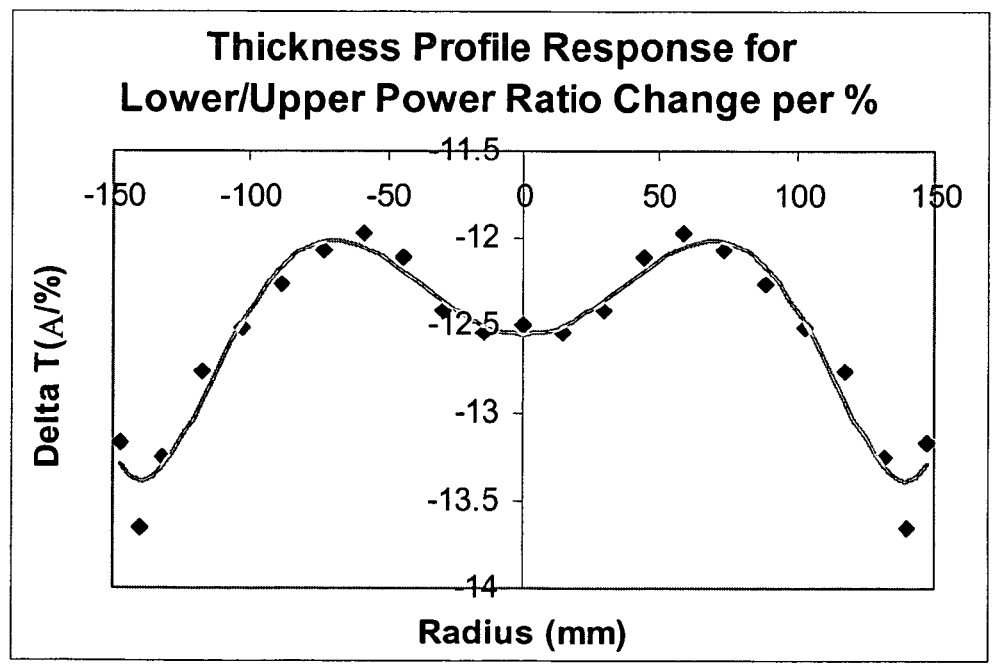

The number of process parameters calculated by the tuning tool was reduced from four to two by looking at the ratio of inner to outer zone lamp power ratio (first parameter), and the upper to lower lamp power ratio (second parameter). With the baseline film already made, three additional wafers were processed and film thicknesses measured. Wafer #1 was run with the same parameters except a 2% higher inner to outer lamp power ratio, and wafer #2 ran with baseline parameters, except for a 2% higher upper to lower lamp power ratio. FIGS. 3A and 3B show changes in the film thickness profiles caused by changes in each process parameter.

In FIG. 3A, a thickness profile is shown for a 2% increase from baseline in the ratio of lamp power between the inner and outer lamp zones. The baseline thickness data was subtracted from the wafer #1 thickness data, and normalized by division with 2%. To remove the slope in the data across the radius, a folding operation was used, and the data was smoothed to get the line shown. In FIG. 3B, a thickness profile is shown for a 2% increase in baseline in the ratio of lamp power between the lower and upper lamp modules. The baseline thickness data was subtracted from the wafer #2 thickness data, and also normalized by division with 2%. A similar folding and smoothing operation was performed to get the line shown. Overall temperature sensitivity was measured at 5.6 Å/K. The data showing the effects of the two process parameters on the uniformity of film thickness were used to determine two gain curves, one for each parameter.

Figure 4:
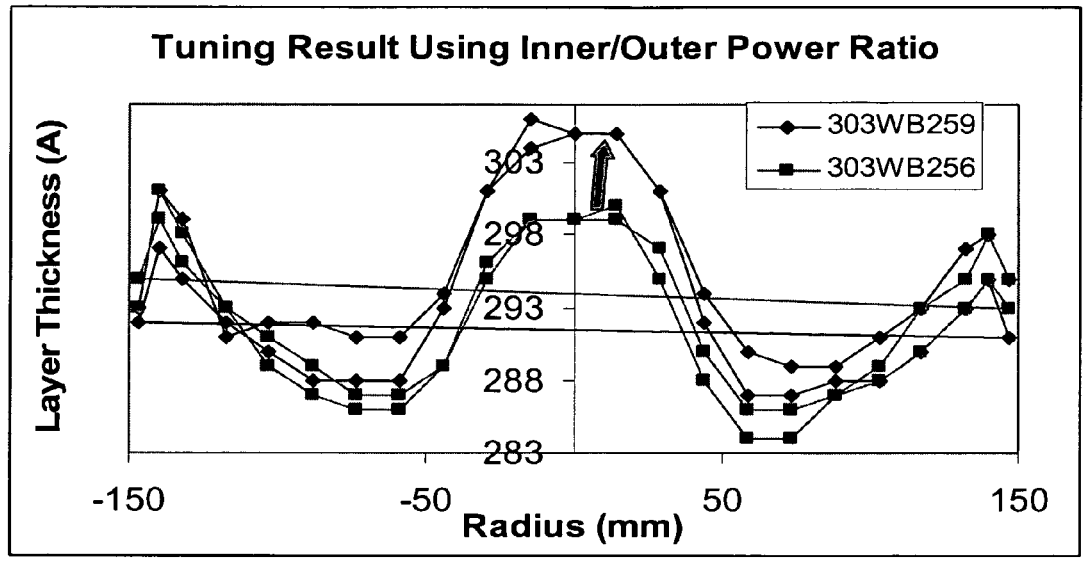
FIG. 4 shows the thickness uniformity results from tuning the process parameters.

The gain curves were incorporated into the tuning tool, and comparative experiments were run for tuning the two process parameters manually and with the tool. FIG. 4 shows the thickness uniformity results from tuning the process parameters. As shown, the thickness variation was 1.7% with an inner to outer power ratio of 52% (Wafer 303WB256), and 1.9% with an inner to outer ratio of 54% (Wafer 303WB259). In summary, with manual tuning the lowest variation in film thickness achieved was about 1.7%. The high thickness variation (i.e., low thickness uniformity) was believed to be caused by interdependencies between lamp power settings that were not well understood. While changes the inner to outer lamp power ratio moved the thickness profile in a way predicted by the gain curve (see FIG. 3A), it did not improve the overall smoothness of the feature in the center of the wafer.

Figure 5:
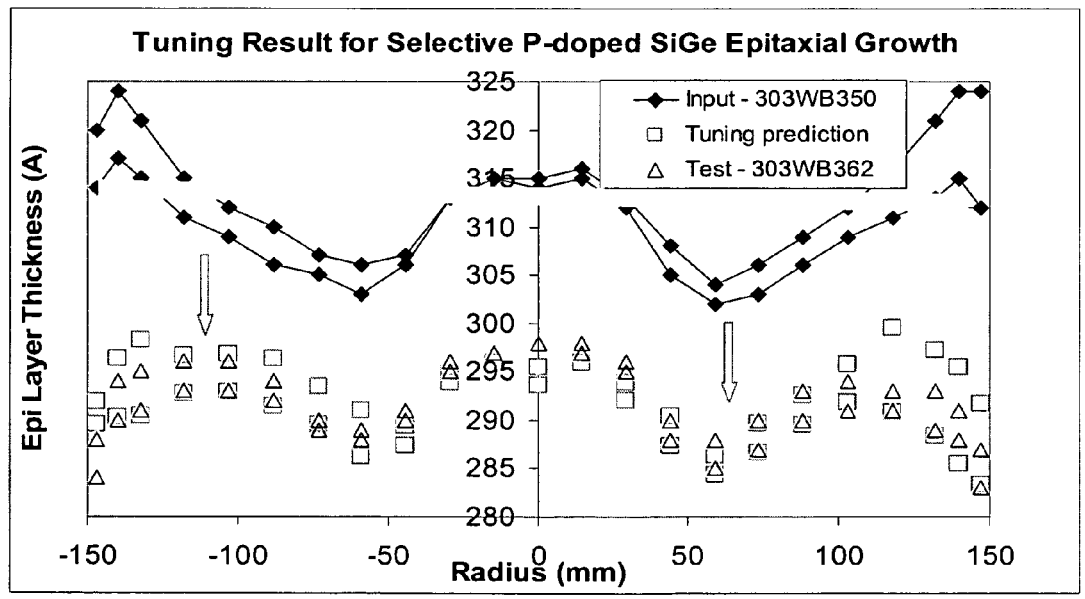
FIG. 5 shows the thickness uniformity results from tuning the process parameters with the aid of the Epi process tuning tool.

FIG. 5 shows the thickness uniformity results from tuning the process parameters with the aid of the Epi process tuning tool. The tuning tool factors the interdependence of the lower to upper and inner to outer ratios of lamp power when calculating the tuning values for both process parameters. The tuning tool output an increase in the upper to lower lamp power ratio by 12%, while decreasing the inner to outer ratio by 1%. The predicted thickness uniformity of 1.3% calculated by the tool matched the actual thickness uniformity achieved in one run (wafer 303WB362). This is down from 1.8% thickness uniformity for the wafer produced with the baseline starting parameters (Wafer 303WB350). Thus, compared with manual tuning, tuning process parameters with the help of the Epi process tuning tool shows significant improvements in thickness uniformity after fewer tuning iterations.

Experiments can also be conducted to develop an effects profile to help achieve target concentration distribution of a dopant. One target profile calls for a substantially uniform concentration of boron of about $1 \times 10^{20}$ atoms/cm$^2$ across a 300 Å thick SiGe epitaxial layer (Ge concentration of 20%). Measurements of the boron concentration distribution can be made after small adjustments to process parameters like the flow rate of a diborane process gas. The measured boron concentration distribution data can then be used to develop an effects profile that relates the effect of the diborane flow rate value to the concentration distribution profile formed in the epitaxial layer. The effects profile may then be used to find values for the diborane flow rate that give the minimum deviation from a uniform concentration distribution profile of boron atoms in the epitaxial layer.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of calculating a process parameter for a deposition of an epitaxial layer on a substrate, the method comprising:
   measuring an effect of the process parameter on a thickness of the epitaxial layer to determine a gain curve for the process parameter; and
   calculating, using the gain curve, a value for the process parameter to achieve a target thickness of the epitaxial layer, wherein the value is calculated to minimize deviations from the target thickness in the layer.

2. The method of claim 1, wherein the value of the process parameter is also calculated to give a uniform distribution of a component of the epitaxial layer.

3. The method of claim 1, wherein the epitaxial layer comprises silicon.

4. The method of claim 3, wherein the epitaxial layer comprises a SiGe layer.

5. The method of claim 1, wherein the epitaxial layer forms part of a BiCMOS circuit.

6. The method of claim 1, wherein the process parameter is selected from the group consisting of a power level for a substrate heating element, a flow rate for a process gas, a flow distribution for a plurality of process gases, and a pressure for a process chamber.

7. The method of claim 1, wherein the method comprises measuring an effect of a second process parameter on the thickness of the epitaxial layer to determine the gain curve.

8. The method of claim 2, wherein the method comprises calculating, using the gain curve, a value for the second process parameter to achieve the target thickness, and wherein the value of the second process parameter is calculated to minimize deviations from the target thickness of the epitaxial layer.

9. The method of claim 1, wherein the target thickness has a linear or non-linear dependence on the process parameter in the gain curve.

10. The method of claim 1, wherein the process parameter is a scalar or a vector.

11. The method of claim 1, wherein the substrate is a 300 mm wafer.

12. A method of setting process parameters for a deposition of an epitaxial layer, the method comprising:
    determining a first gain equation comprising a first relationship between a first process parameter and a thickness of the epitaxial layer;
    determining a second gain equation comprising a second relationship between a second process parameter and the thickness of the epitaxial layer; and
    calculating, using the first and second gain equations, values for the first and second process parameters to achieve the target thickness, wherein the values are calculated to give a uniform distribution of a component of the epitaxial layer.

13. The method of claim 12, wherein the epitaxial layer comprises a SiGe layer, and the uniformly distributed component of the epitaxial layer comprises the germanium in the layer.

14. The method of claim 12, wherein the uniformly distributed component of the epitaxial layer comprises a dopant.

15. The method of claim 12, wherein the values of the first and second process parameters are also calculated to minimize deviations from the target thickness of the epitaxial layer.

16. The method of claim 12, wherein the first process parameter is a power level for a substrate heating element, and the second process parameter is a flow distribution for a plurality of process gases.

17. The method of claim 16, wherein the plurality of process gases comprises a silicon containing gas, and a germanium containing gas.

18. The method of claim 16, wherein the plurality of process gases comprises hydrogen, hydrogen chloride, or phosphine.

19. A method of setting a process parameter for a deposition of an epitaxial layer on a substrate, the method comprising:
measuring an effect of a process parameter on a concentration distribution of a material in the epitaxial layer to determine an effect profile for the process parameter;
calculating, using the effect profile, a value for the process parameter to achieve a target concentration profile of the material in the epitaxial layer, wherein the value is calculated to minimize deviations from the target concentration profile in the layer.

20. The method of claim 19, wherein the target concentration profile comprises a uniform concentration of the material throughout the epitaxial layer.

21. The method of claim 19, wherein the material is selected from the group consisting of boron, phosphorus, arsenic, germanium, indium, gallium, tin, carbon, nitrogen, and oxygen.

22. The method of claim 19, wherein the process parameter is selected from the group consisting of a power level for a substrate heating element, a flow rate for a process gas, a flow distribution for a plurality of process gases, and a pressure for a process chamber.

23. The method of claim 19, wherein the process parameter is a flow rate for a process gas selected from the group consisting of monosilane, trichlorosilane, dichlorosilane, tetrachlorosilane, phosphine, diborane, germaine, arsine, oxygen, methane, ammonia, methyl-silane, and hydrogen.

* * * * *